United States Patent [19]

Leung et al.

[11] 4,233,646
[45] Nov. 11, 1980

[54] LATCHING LEVER FOR PRINTED CIRCUIT BOARDS

[75] Inventors: Ernest C. Leung, Ottawa; Isaac R. Revah, Willowdale, both of Canada

[73] Assignee: Northern Telecom Limited, Montreal, Canada

[21] Appl. No.: 61,689

[22] Filed: Jul. 30, 1979

[30] Foreign Application Priority Data

Jun. 29, 1979 [CA] Canada .................................. 330868

[51] Int. Cl.³ .............................................. H05K 1/18
[52] U.S. Cl. ...................................... 361/399; 211/41; 292/DIG. 72; 292/241; 361/415
[58] Field of Search ................. 361/415, 399; 211/41; 16/112, 115; 292/209, 241, DIG. 72

[56] References Cited

U.S. PATENT DOCUMENTS

| | | | |
|---|---|---|---|
| T876,004 | 7/1970 | Andreni | 339/45 |
| 2,767,008 | 10/1956 | Oswald | 292/241 |
| 3,311,863 | 3/1967 | Beale | 361/415 X |
| 3,736,471 | 5/1973 | Donze | 361/415 |
| 3,767,974 | 10/1973 | Donovan | 361/415 |
| 3,798,507 | 11/1972 | Damon | 317/101 DH |
| 3,829,741 | 8/1974 | Athey | 361/399 |
| 3,853,379 | 12/1974 | Goodman | 361/415 X |
| 3,939,382 | 2/1976 | Lacan | 361/415 |
| 3,952,232 | 4/1976 | Coules | 317/101 DH |
| 4,002,381 | 1/1977 | Wagner | 361/415 X |
| 4,064,551 | 11/1976 | Lightfoot | 361/399 |

*Primary Examiner*—Richard R. Kucia
*Attorney, Agent, or Firm*—Robert C. Hogeboom

[57] ABSTRACT

An improved latching lever for use with a printed circuit board (PCB). The latching mechanism comprises a hooked portion flexibly connected to the body portion of the latching lever, an actuating member solidly connected to the hooked portion for moving the hooked portion relative to the body portion, and a stop portion, solidly connected to the body portion for limiting the movement of the actuating member. A stud carried by the PCB is engaged by the hooked portion of the lever to enable the lever to latch. Moving the actuating member to touch the stop portion disengages the hooked portion from the stud, thereby unlatching the lever, and leaving the lever free to pivot about its pivot point.

9 Claims, 6 Drawing Figures

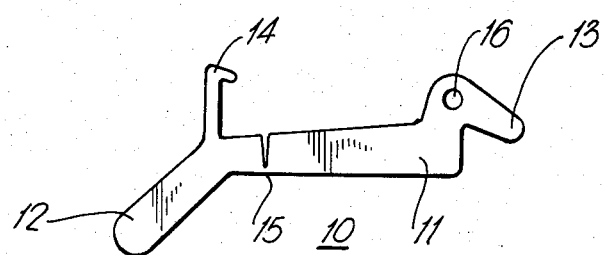
Fig-1-
(PRIOR ART)
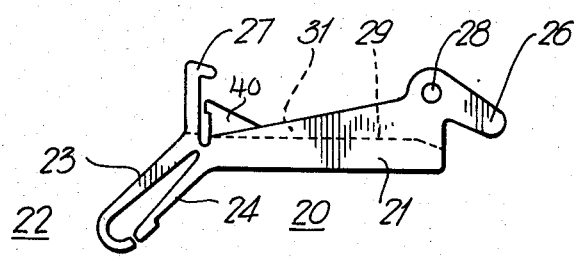
Fig-2-
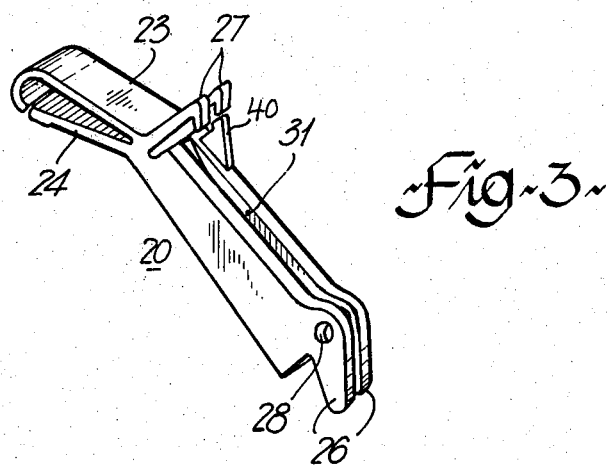
Fig-3-

LATCHING LEVER FOR PRINTED CIRCUIT BOARDS

This invention relates generally to devices for aiding the insertion into, the removal from, and the retention in, of objects relative to a mating piece of apparatus, and more particularly to a device for use with printed circuit boards (PCBs) for aiding their insertion into, removal from, and retention in, a holder for PCBs.

BACKGROUND OF THE INVENTION

Printed circuit boards (PCBs) are generally mounted in frames, with a large number of PCBs mounted in each frame, with as high a density as possible, in order to save space. A typical PCB comprises a pattern of electrical interconnections on a flat rectangular sheet of insulating material (such as glass-fibre reinforced resin) and carries a number of components on one of its flat faces. The four edges of the PCB can be referred to as a front edge, a back (or rear) edge, a top edge, and a bottom edge. The PCB slides into guide channels in the frame, the PCBs lying normally in a vertical plane with the top edge in a top guide channel, the bottom edge in a bottom guide channel, and the rear edge carrying a set of connections which mate with a corresponding set of connections mounted to the frame. The front edge of the PCB may carry two devices (one usually near the top, and one usually near the bottom) to aid in inserting, removing or retaining the PCB relative to the frame.

Various prior art devices for performing this function are depicted in the following U.S. patents and attention is directed to them: U.S. Pat. No. 4,064,551 dated Dec. 20, 1977 to R. Lightfoot; U.S. Pat. No. 3,798,507 dated Mar. 19, 1974 to N. F. Damon and H. G. Yeo; U.S. Pat. No. 3,952,232 dated Apr. 20, 1976 to R. A. Coules; and U.S. Defensive Publication T876,004 dated July 28, 1970 to J. Andreini et al. Another prior art device in pictured on pages 78 and 79 of the Fall 1975 Issue of *Telesis* published by Bell-Northern Research Ltd., Ottawa, Ontario, Canada.

The prior art device on pages 78 and 79 of the *Telesis* article, previously mentioned, is referred to as a latching lever. This prior art latching lever will be described in greater detail later, but its latching feature will now be briefly described. The latching feature is accomplished by a hooked portion that straddles the PCB and engages a pin mounted in the PCB. A handle, attached to the hooked portion, enables the hooked portion to be disengaged from the pin, thereby allowing the latching lever to pivot. The handle and hooked portion form one integral unit which is attached to the main body portion of the latching lever by a thin web of material. This thin web of material permits the latching lever to latch and to unlatch, but it is also a weak point in the latching lever in that the line of force, between the handle and the lever's pivot point, for pivoting the lever, is carried by the web. This results in a lot of stress being applied to the web making it prone to breakage.

The present invention overcomes this problem by providing a latching lever with an improved latching mechanism. The latching mechanism of the latching lever of the present invention comprises a hooked portion flexibly connected to the body portion of the latching lever, an actuating member solidly connected to the hooked portion for moving the hooked portion relative to the body portion, and a stop portion, solidly connected to the body portion for limiting the movement of the actuating member. The line of force, between the handle and the lever's pivot point, for pivoting the lever, is carried by the stop portion and the body portion; it does not pass through the material by which the hooked portion is mounted to the body portion.

Stated in other terms, the present invention is a latching lever for use with an object for aiding the entry of the object into a mating apparatus, for securing the object in the mating apparatus, and for aiding the removal of the object from the mating apparatus, the latching lever characterized by: a body portion for pivotal connection to the object, about a pivot point; a hooked portion, flexibly mounted to the body portion, and projecting therefrom at the end of the body portion remote from the pivot point, for engaging a projection attached to the object; an actuating member, solidly connected to said hooked portion and protruding therefrom, for moving the hooked portion relative to the body portion, so as to selectively disengage the hooked portion from the projection; a stop portion, solidly connected to the body portion and protruding therefrom, located adjacent the actuating member, but spaced therefrom so as to provide a limit to the movement of the actuating member.

Stated in yet other terms, the present invention is a latching lever for use with a piece of sheet material for aiding the entry of the piece into a mating apparatus, for securing the piece in the mating apparatus, and for aiding the removal of the piece from the mating apparatus, the latching lever characterized by: a body portion for pivotal connection to the object, about a pivot point; a hooked portion, flexibly mounted to the body portion, and projecting therefrom at the end of the body portion remote from the pivot point, for engaging a projection attached to the piece; an actuating member, solidly connected to the hooked portion and protruding therefrom, for moving the hooked portion relative to the body portion, so as to selectively disengage the hooked portion from the projection; a stop portion, solidly connected to the body portion and protruding therefrom, located adjacent the actuating member, but spaced therefrom so as to provide a limit to the movement of the actuating member; an arm portion protruding from the body portion, close to the pivot point, for engaging the mating apparatus during entry thereinto, for aiding the entry, and for blocking the removal of the piece until the lever is pivoted to an alternate position.

Stated in still other terms, the present invention is the combination of a printed circuit board (PCB) and a latching lever for use in aiding the entry of the PCB into a mating apparatus, for securing the PCB in the mating apparatus, and for aiding the removal of the PCB from the mating apparatus, the combination characterized by: a printed circuit board; at least one latching lever pivotally connected to the printed circuit board; at least one stud attached to the PCB, and protruding from both planar surfaces of the PCB, for engaging the lever, one stud for each lever; the latching lever comprising: a body portion for pivotal connection to the PCB, about a pivot point; a hooked portion, flexibly mounted to the body portion, and projecting therefrom at the end of the body portion remote from the pivot point, for selectively engaging the stud; an actuating member, solidly connected to the hooked portion and protruding therefrom, for moving the hooked portion relative to the body portion, so as to selectively disengage the hooked portion from the stud; a first stop portion, solidly connected to the body portion and protruding therefrom, located adjacent the actuating member, but spaced therefrom so as to provide a limit to the movement of the actuating member; a second stop portion, solidly connected to said body portion and protruding therefrom, located adjacent said hooked portion, but spaced therefrom so as to provide a limit to the movement of said hooked portion; an arm portion protruding from the body portion, close to the pivot point, for engaging the mating apparatus during entry thereinto, for aiding the entry, and for blocking the removal of the piece until the lever is pivoted to an alternate position.

BRIEF DESCRIPTION OF THE DRAWINGS

The invention will now be described in greater detail with reference to the accompanying drawings, wherein like parts in each of the several figures are identified by the same reference character, and wherein:

FIG. 1 is a simplified profile view of one prior art latching lever;

FIG. 2 is a simplified profile view of the latching lever of the present invention;

FIG. 3 is a simplified perspective view of the latching lever of FIG. 2;

DETAILED DESCRIPTION

Figure 6:
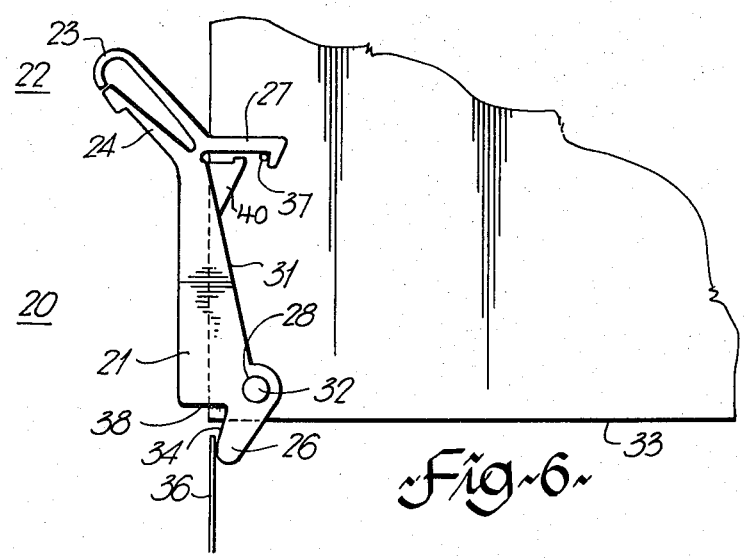
FIG. 6 is a view similar to that in FIGS. 4 and 5, but showing the printed circuit board in its installed position and showing the latching lever in its latched position.

The prior art latching lever 10 of FIG. 1 will now be described. The lever 10 consists of a body portion 11, a handle portion 12, an arm portion 13, and a hooked portion 14. The handle portion 12 is connected to the body portion 11 by a thin web of material 15. A pivot point 16 is used to mount the lever 10 to a printed circuit board (not shown). The arm portion 13 straddles the printed circuit board (PCB) and a rivet through the pivot point 16 and the PCB allows the lever 10 to pivot. The hooked portion 14 straddles the PCB and in one position the hooked portion 14 engages a pin protruding through the PCB, thus holding the lever 10 in a secured position. By pivoting the handle portion 12 about the body portion 11, at web 15, the hooked portion 14 is made to disengage the pin (not shown) in the PCB, and leave the body portion 11 free to pivot about the pivot point 16.

In order to make lever 10 pivot about pivot point 16, force is applied to handle portion 12. This force is transmitted to body portion 11 via web 15. Handle portion 12 is free to pivot about a large angular displacement (well in excess of ninety degrees). The force applied to web 15, and the large angular displacement to which web 15 is exposed, place great strains upon web 15. Additionally, web 15 generally appears, on the face of lever 10, as a strip of material of dissimilar colour to the remainder of lever 10, thus detracting from the appearannce of lever 10.

Figure 4:
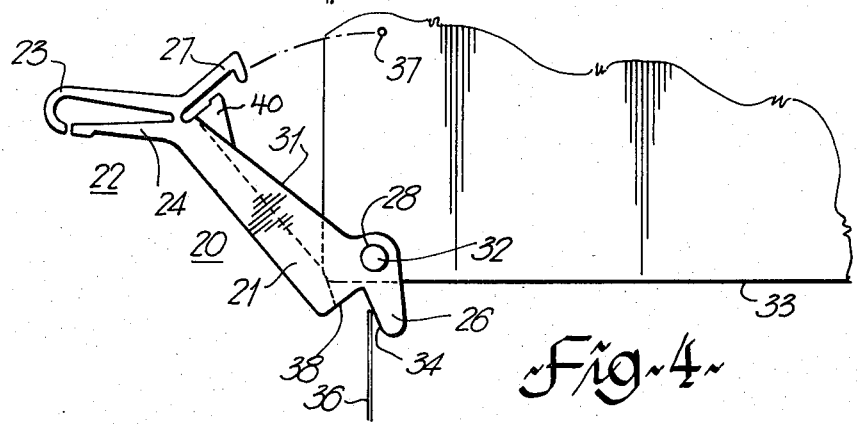
FIG. 4 is a simplified view of the latching lever of FIG. 2 attached to a printed circuit board in the process of being inserted into a mating frame.

FIG. 2 depicts latching lever 20 constructed according to the present invention. Latching lever 20 comprises a body portion 21, a handle portion 22 comprising both an actuating member 23 and a stop portion 24; an arm portion 26; a hooked portion 27; and a pivot point 28 for pivotally mounting lever 20 to a printed circuit board 33 (FIG. 4). The dashed line 29 is used to indicate that the portion of lever 20 below line 29 is one solid unit, and the portion of lever 20 above line 29 is split into two sections by groove (or opening) 31, as is more apparent in FIG. 3. Groove 31 allows lever 20 to straddle the edge of PCB 33 (see FIG. 4). In the preferred embodiment lever 20 is made of polypropylene copolymer.

FIG. 3 is a perspective view of lever 20. FIG. 3 shows groove 31 and pivot point 28 which is an opening (i.e. hole) in lever 20. A metal rivet 32 (see FIG. 4) passes through pivot point 28 and attaches the lever 20 to the printed circuit board 33 (FIG. 4) while allowing lever 20 to pivot about the pivot point 28.

FIG. 4 depicts lever 20 pivotally mounted to PCB 33 by rivet 32. In FIG. 4, lever 20 is depicted in the act of inserting PCB 33, as evidenced by the surface 34 of arm portion 26 bearing against support piece 36. In FIG. 4, the hooked portion 27 is travelling toward pin (or stud) 37, i.e. moving in a clockwise direction. Pin 37 is carried by PCB 33 and protrudes from both the plane surfaces of PCB 33 so as to engage both pieces of hooked portion 27. Note that support piece 36 is a part of the equipment frame (not shown) into which PCB 33 is inserted. Note also that PCB 33 enters groove 31 so that lever 20 straddles the edge of PCB 33 with one section of hooked portion 27 on one side of PCB 33 and the other section of hooked portion 27 on the other side of PCB 33.

Figure 5:
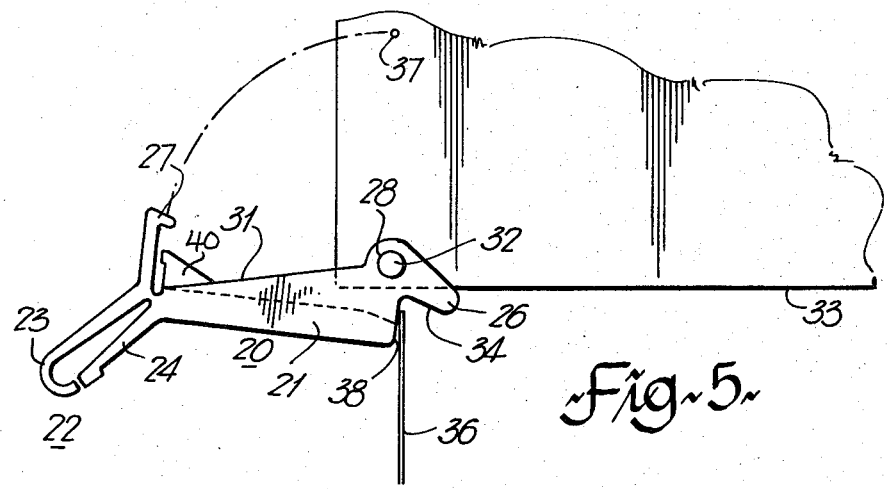
FIG. 5 is a view similar to that of FIG. 4 but showing the printed circuit board in the process of being removed from the mating frame.

FIG. 5 is similar to FIG. 4 but shows lever 20 in the act of removing PCB 33. Hooked portion 27 is moving away from pin 37 (i.e. moving in a counter-clockwise direction) and surface 38 of body portion 21 is bearing against support piece 36, thus causing PCB 33 to move towards the left of the Figure, thereby aiding in the removal of PCB 33.

FIG. 6 depicts lever 20 in its latched position with hooked portion 27 engaging pin 37. Arm portion 26 protrudes below PCB 33 and to the right of support piece 36; this prevents PCB 33 from being removed. To remove PCB 33, actuating member 23 is moved to meet stop portion 24; this disengages hooked portion 27 from pin 37 and allows lever 20 to be pivoted about rivet 32 to aid in removing PCB 33 as depicted previously in FIG. 5. In the preferred embodiment, pressure exerted by the human hand (e.g. between the thumb and forefinger) is more than sufficient to unlatch lever 20 (i.e. to move actuating member 23 to meet stop 24 and thus disengage hooked portion 27 from pin 37). Once this is accomplished, human hand pressure is adequate to rotate lever 20 about rivet 32, in a counter-clockwise direction, thus aiding in the removal of PCB 33. Triangular stop 40 limits the movement of hooked portion 27; thus hooked portion 27 is free to move between the limits defined by stop portion 24 (engaging actuating member 23) and triangular stop 40.

From the Figures it can be seen that the force required to pivot lever 20 about pivot point 28 is applied to body portion 21 directly by stop portion 24. Neither the actuating member 23, nor the hooked portion 27, nor their attachment to body portion 21 plays any part in the pivoting of lever 20. The latching and unlatching of lever 20 is quite separate from its pivoting action.

What is claimed is:

1. A latching lever for use with an object for aiding the entry of said object into a mating apparatus, for securing said object in said mating apparatus, and for aiding the removal of said object from said mating apparatus, said latching lever characterized by:
- a body portion for pivotal connection to said object, about a pivot point;
- a hooked portion, flexibly mounted to said body portion, and projecting therefrom at the end of said body portion remote from said pivot point, for engaging a projection attached to said object;
- an actuating member, solidly connected to said hooked portion and protruding therefrom, for moving said hooked portion relative to said body portion, so as to selectively disengage said hooked portion from said projection;
- a stop portion, solidly connected to said body portion and protruding therefrom, located adjacent said actuating member, but spaced therefrom so as to provide a limit to the movement of said actuating member.

2. The latching lever of claim 1 further including an arm portion, close to said pivot point, for engaging the mating apparatus during entry thereinto, for aiding said entry, and for blocking the removal of said object until said lever is pivoted to an alternate position.

3. The latching lever of claim 2 wherein said body portion, proximate said pivot point, defines a surface for engaging the mating apparatus during the removal of said object for aiding said removal.

4. A latching lever for use with a piece of sheet material for aiding the entry of said piece into a mating apparatus, for securing said piece in said mating apparatus, and for aiding the removal of said piece from said mating apparatus, said latching lever characterized by:
- a body portion for pivotal connection to said object, about a pivot point;
- a hooked portion, flexibly mounted to said body portion, and projecting therefrom at the end of said body portion remote from said pivot point, for engaging a projection attached to said piece;
- an actuating member, solidly connected to said hooked portion and protruding therefrom, for moving said hooked portion relative to said body portion, so as to selectively disengage said hooked portion from said projection;
- a stop portion, solidly connected to said body portion and protruding therefrom, located adjacent said actuating member, but spaced therefrom so as to provide a limit to the movement of said actuating member;
- an arm portion protruding from said body portion, close to said pivot point, for engaging said mating apparatus during entry thereinto, for aiding said entry, and for blocking the removal of said piece until said lever is pivoted to an alternate position.

5. The latching lever of claim 4 wherein said body portion, proximate said pivot point, defines a surface for engaging the mating apparatus during the removal of said piece for aiding said removal.

6. The latching lever of claim 5 wherein said piece of sheet material is a printed circuit board.

7. The latching lever of claim 4, 5 or 6 wherein said lever partially straddles one corner of said piece of sheet material such that at least said hooked portion, said pivot point, and said arm portion are each at least partially bisected by an opening in said lever into which at least one edge of said piece of sheet material protrudes when said latching lever is in its latched position.

8. The combination of a printed circuit board (PCB) and a latching lever for use in aiding the entry of said PCB into a mating apparatus, for securing said PCB in said mating apparatus, and for aiding the removal of said PCB from said mating apparatus, said combination characterized by:
- a printed circuit board;
- at least one latching lever pivotally connected to said printed circuit board;
- at least one stud attached to said PCB, and protruding from both planar surfaces of said PCB, for engaging said lever, one stud for each said lever;
- said latching lever comprising: a body portion for pivotal connection to said PCB, about a pivot point; a hooked portion, flexibly mounted to said body portion, and projecting therefrom at the end of said body portion remote from said pivot point, for selectively engaging said stud; an actuating member, solidly connected to said hooked portion and protruding therefrom, for moving said hooked portion relative to said body portion, so as to selectively disengage said hooked portion from said stud; a first stop portion, solidly connected to said body portion and protruding therefrom, located adjacent said actuating member, but spaced therefrom so as to provide a limit to the movement of said actuating member; a second stop portion, solidly connected to said body portion and protruding therefrom, located adjacent said hooked portion, but spaced therefrom so as to provide a limit to the movement of said hooked portion; an arm portion protruding from said body portion, close to said pivot point, for engaging said mating apparatus during entry thereinto, for aiding said entry, and for blocking the removal of said piece until said lever is pivoted to an alternate position.

9. The combination of claim 8 wherein said latching lever partially straddles one corner of said printed circuit board (PCB) such that at least said hooked portion, said pivot point, and said arm portion are each at least partially bisected by an opening in said lever into which at least one edge of said PCB protrudes when said latching lever is in its latched position.

* * * * *